United States Patent
Van Buel

(10) Patent No.: US 7,251,018 B2
(45) Date of Patent: Jul. 31, 2007

(54) SUBSTRATE TABLE, METHOD OF MEASURING A POSITION OF A SUBSTRATE AND A LITHOGRAPHIC APPARATUS

(75) Inventor: Henricus Wilhelmus Maria Van Buel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 66 days.

(21) Appl. No.: 10/998,180

(22) Filed: Nov. 29, 2004

(65) Prior Publication Data

US 2006/0114442 A1    Jun. 1, 2006

(51) Int. Cl.
G03B 27/52 (2006.01)
G03B 27/42 (2006.01)
G03B 27/58 (2006.01)

(52) U.S. Cl. ............................. 355/55; 355/53; 355/72
(58) Field of Classification Search ................. 355/52, 355/53, 55, 67; 356/399–401; 250/548
See application file for complete search history.

(56) References Cited

U.S. PATENT DOCUMENTS

| | | | |
|---|---|---|---|
| 4,596,467 A | 6/1986 | Bartelt | |
| 5,074,667 A * | 12/1991 | Miyatake | 356/401 |
| 5,929,997 A | 7/1999 | Lin | |
| 5,985,764 A | 11/1999 | Lin et al. | |
| 6,088,103 A | 7/2000 | Everett et al. | |
| 6,091,481 A | 7/2000 | Mori | |
| 6,376,329 B1 | 4/2002 | Sogard et al. | |
| 6,525,805 B2 | 2/2003 | Heinle | |
| 6,768,539 B2 * | 7/2004 | Gui et al. | 355/53 |
| 6,936,385 B2 * | 8/2005 | Lof et al. | 430/22 |
| 2003/0224262 A1 | 12/2003 | Lof et al. | |
| 2004/0179184 A1 | 9/2004 | Lavasier et al. | |
| 2005/0133743 A1 | 6/2005 | Schets et al. | |

FOREIGN PATENT DOCUMENTS

EP   1 341 046 A2   9/2003
EP   1 615 077 A2   1/2006

OTHER PUBLICATIONS

Partial European Search Report issued in EP 05 11 0761, May 26, 2006.

* cited by examiner

Primary Examiner—Henry Hung Nguyen
(74) Attorney, Agent, or Firm—Pillsbury Winthrop Shaw Pittman, LLP

(57) ABSTRACT

The invention relates to a substrate table arranged to support a substrate provided with at least one substrate mark. The at least one substrate mark having a position that can be measured using an alignment system. The substrate table is provided with an optical system having a magnification factor deviating from 1, for providing an image of the at least one alignment mark to be measured by the alignment system.

10 Claims, 3 Drawing Sheets

SUBSTRATE TABLE, METHOD OF MEASURING A POSITION OF A SUBSTRATE AND A LITHOGRAPHIC APPARATUS

FIELD OF THE INVENTION

The present invention relates to a substrate table arranged to support a substrate provided with at least one substrate mark, the at least one substrate mark having a position that can be measured using an alignment system. The present invention further relates to a method of measuring a position of a substrate on the substrate table.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although specific reference may be made to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

Alignment is the process of positioning the image of a specific point on the mask to a specific point on the substrate that is to be exposed. Typically one or more alignment marks, such as a small pattern, are provided on each of the substrate and the mask. A device may comprise many layers that are built up by successive exposures with intermediate processing steps. Before each exposure, alignment is performed to minimize any positional error between the new exposure and the previous ones, such error being termed overlay error.

However, some of the intermediate processing steps, such as chemical mechanical polishing (CMP), rapid thermal annealing, thick layer deposition and deep trench etching, can damage or distort the alignment marks on the substrate or bury them under opaque layers. Thus, sometimes the alignment marks are not clearly visible or not visible at all, negatively influencing the accuracy of alignment. This can cause overlay errors.

In some technologies, such as micro systems technology (MST) and micro electromechanical systems (MEMS), devices are fabricated using both sides of a substrate. This technology faces a problem with performing exposures on one side of a substrate such that they are accurately aligned with features previously exposed on the other side of the substrate. An alignment accuracy of the order of 0.5 microns or better is typically required.

New techniques are developed that allow the imaging of patterning features having even smaller patterns by using so-called immersion techniques. This technique is based on the fact that the space between the lens and the substrate is filled with a fluid, such as water. Since the refractive index of water is higher than the refractive index of air of some low pressure gas, the numerical aperture of the system is increased. This allows the system to image even smaller patterns, while using the same radiation system and projection system. More information about immersion techniques may be found in EP 1 420 298 A2, EP 1 429 188 and EP 1 420 300 A2. The presence of water may, however, influence the alignment measurements. As a result of the presence of water in the space between the lens and the substrate, it becomes difficult to perform alignment measurements on marks provided on the substrate. Furthermore, comparing such 'wet' measurements with previously obtained 'dry' alignment measurements is also rather difficult.

The conventional alignment techniques are all performed on the top side of the substrate, i.e. at the side at which the exposure is performed. This side will be referred to as the first side or the front side of the substrate. Such alignment techniques all measure the position of the substrate by measuring the position of alignment marks provided on the top side of the substrate. However, in combination with immersion techniques and with substrates fabricated from both sides, these conventional alignment techniques are difficult to perform and are less accurate.

Conventional alignment techniques typically use optical measurement techniques that measure the position of alignment marks provided on the top side of the substrate, i.e. the side of the substrate that does not face the substrate table on which the substrate is positioned. This makes it difficult to use these alignment techniques in combination with devices fabricated from both sides since, in that case, a substrate needs to be positioned such that the alignment marks face the substrate table.

In the event immersion techniques are used, the optics of the alignment system are usually positioned outside the area filled with liquid, so the optics and/or the optical signals need to be guided into the liquid. This is not an easy task and requires complicated and expensive techniques.

In order to overcome these problems, alignment techniques have been developed, that are arranged to measure the position of an alignment mark provided on the back-side of the substrate, i.e. the side of the substrate facing the substrate table and the side that is not exposed. This side will also be referred to as the second side of the substrate.

During alignment, the second side faces the substrate table that supports the substrate. In order to allow measuring the position of the alignment marks provided on the second side of the substrate, optical devices are provided in the substrate table. This technique is generally referred to as backside alignment and will be discussed in more detail below. A more extensive description can be found in US 2002/0109825 A1, owned by ASML.

The perception at this moment is that alignment measurements via the second side of the substrate using the optical devices provided in the substrate table may be less accurate than alignment measurements based on alignment markers provided on the first side of the substrate that can be measured directly. Therefore, improvements of backside alignment techniques are needed.

In general, there is a need for improvements to alignment techniques, back side as well as front side, to allow a more accurate measurement of the position of a substrate located on a substrate table and to achieve better alignment results.

Throughout this specification, reference to an alignment mark being located on a particular side of the substrate includes the alignment mark being etched into a respective side of the substrate and includes having subsequent material deposited on top of the alignment mark such that it is embedded and is no longer necessarily exposed at the surface.

Although specific reference may be made to the use of the apparatus in the manufacture of ICs or MEMs, it should explicitly be understood that such an apparatus has many other possible applications. For example, the apparatus may be employed in the manufacture of integrated optical systems, guidance and detection patterns for magnetic domain memories, liquid-crystal display panels, thin-film magnetic heads, etc.

SUMMARY

It is an object of the invention to provide a substrate table that allows more accurate measurement of the position of a substrate positioned on the substrate table. According to an aspect of the invention, there is provided a substrate table and an optical system having a magnification factor deviating from 1, for providing an image of the at least one alignment mark to be measured by the alignment system.

With such a substrate table the position of the alignment marks may be determined more accurately by magnifying the image of the at least one alignment mark, thereby enabling a more accurate determination of the position of the substrate. As a result of the magnification, the movements of the substrate are enlarged by a magnification factor M, thus reducing part of the alignment error.

The substrate table may be provided with a magnification factor that is larger than 1. Alternatively, the substrate table may be provided with a magnification factor that is smaller than 1, thus in fact being a reduction instead of a magnification. Such a substrate table may be used to solve the problem that the alignment system is not able to find the substrate mark when it is located outside the capture range of the alignment system, as will be further explained below. By providing a substrate table arranged to provide an image of a substrate mark with a magnification factor smaller than 1, the capture range is increased. Thus, the term magnification is in this application includes enlargement as well as reduction or shrinking.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
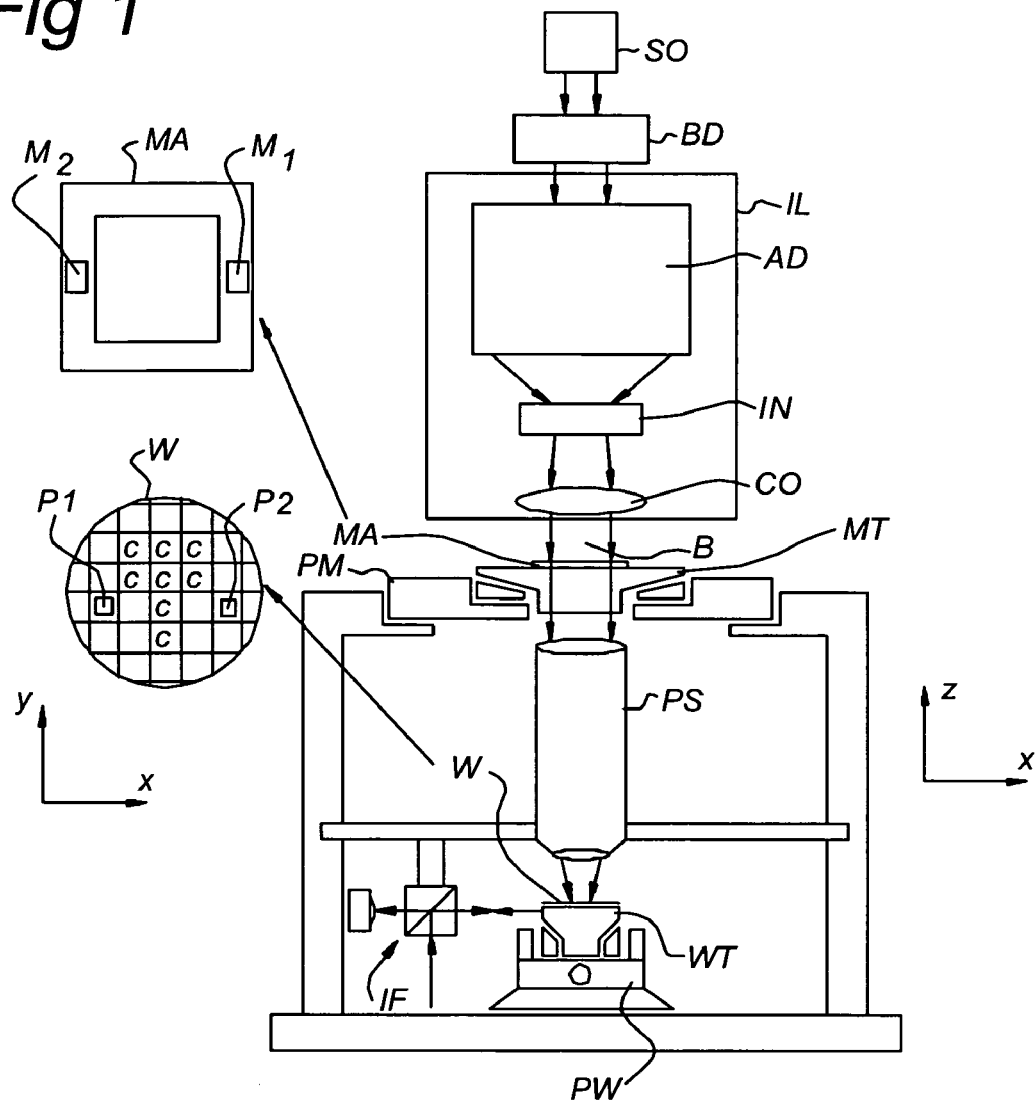
FIG. 1 illustrates a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a substrate table) WT constructed to hold a substrate (e.g. a resist-coated substrate) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

In an exemplary embodiment of the invention, the apparatus is of a transmissive type (e.g. employing a transmissive mask). Alternatively, the apparatus may be of a reflective type (e.g. employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks).

Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2:
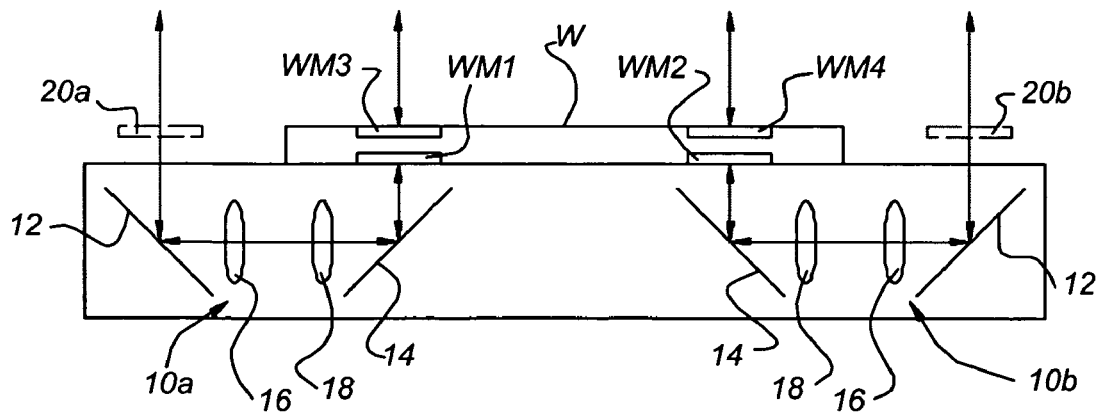
FIG. 2 is a schematic cross section illustrating the substrate table incorporating two branches of an optical system for double side alignment.

FIG. 2 shows a substrate W on a substrate table WT. Substrate marks WM3 and WM4 are provided on a first side ("front side") of the substrate W and light may be reflected from these marks, as indicated by the arrows above WM3 and WM4, and used for alignment with marks on a mask in conjunction with an alignment system (not shown). A more detailed description of this is disclosed in U.S. patent application Ser. No. 10/736,911, filed 17 Dec. 2003, which is hereby incorporated by reference in its entirety.

Further, substrate marks WM1 and WM2 are provided on a second side ("back side") of the substrate W. An optical system is built into the substrate table WT for providing optical access to the substrate marks WM1, WM2 on the back side of the substrate W. The optical system comprises a pair of arms 10a, 10b. Each arm consists of two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror. Of course, other ways of obtaining the 180° change in direction can be thought of. For instance, the lenses and the mounting may be designed in such a way that they may take account of a large part of the direction change, as long as the total of the optical system provides a direction change of 180°.

In use, light is directed from above the substrate table WT onto mirror 12, through lenses 16 and 18, onto mirror 14 and then onto the respective substrate mark WM1, WM2. Light is reflected off portions of the substrate mark and returns along the arm of the optical system via mirror 14, lenses 18 and 16 and mirror 12. The mirrors 12, 14 and lenses 16, 18 are arranged such that an image 20a, 20b20a, 20b of the substrate mark WM1, WM2 is formed at the plane of the front (top) surface of the substrate W, corresponding to the vertical position of any substrate marks WM3, WM4 provided on the front side of the substrate W. The order of the lenses 16, 18 and the mirrors 12, 14 may be different, as appropriate to the optical system. For example, lens 18 may be between the mirror 14 and the substrate W (see illustrations of later embodiments).

Image 20a, 20b of substrate mark WM1, WM2 acts as a virtual substrate mark and may be used for alignment by the pre-existing alignment system (not shown) in exactly the same way as a real substrate mark provided on the front (top) side of the substrate W.

Figure 3:
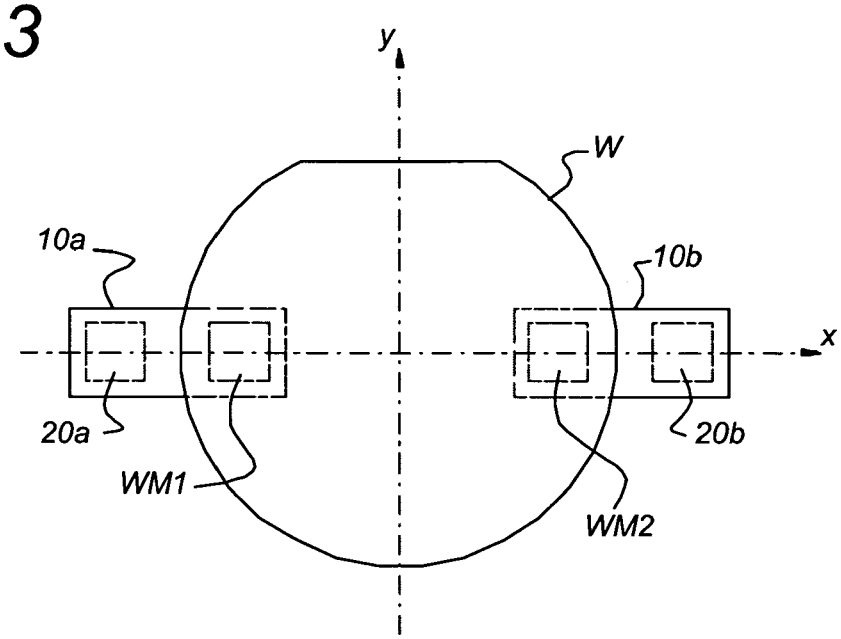
FIG. 3 is a plan view of a substrate showing the position and orientation of the double side alignment optics.
Figure 4:
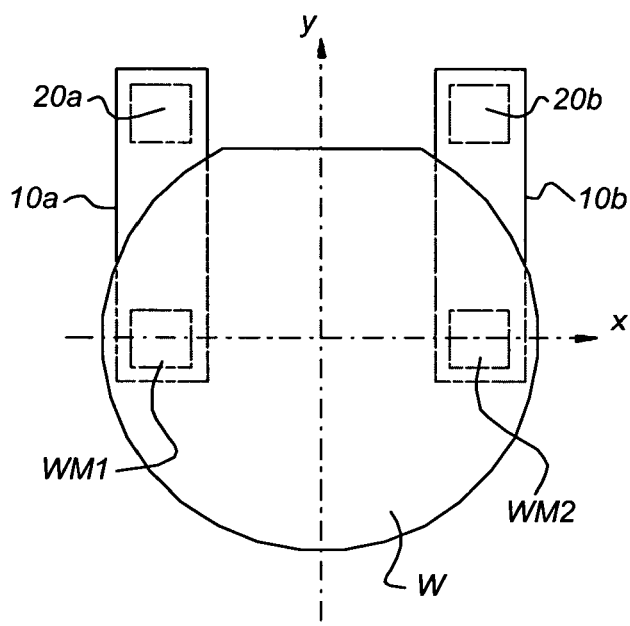
FIG. 4 is plan view showing an alternative position and orientation of the double side alignment optics.

As shown in FIG. 2, the arms of the optical system 10a, 10b produce images 20a, 20b which are displaced to the side of the substrate W so that they may be viewed by an alignment system above the substrate W. Two preferred orientations of the arms of the optical system 10a, 10b are shown in FIGS. 3 and 4, which are plan views of the substrate W, which lies in the XY plane. The substrate table WT is omitted from FIGS. 3 and 4 for clarity. In FIG. 3, the arms of the optical system 10a, 10b are aligned along the X axis. In FIG. 4, the arms of the optical system 10a, 10b are parallel to the Y axis. In both cases, the substrate marks WM1, WM2 lie on the X axis. The substrate marks WM1, WM2 are located on the underside of the substrate W, so they are reversed from the point of view of the top side of the substrate W. However, the arrangement of the mirrors 12, 14 of the arms of the optical system may be configured so that the images 20a, 20b of the substrate marks WM1, WM2 are restored proper orientation. Thus the images appear exactly the same as if they were on the top side of the substrate W. The optical system also may be arranged so that the ratio of the size of a substrate mark WM1, WM2 to its image 20a, 20b is 1:1 i.e. there is no magnification or reduction. Consequently, the images 20a, 20b can be used exactly as if they were real substrate marks on the front side of the substrate W. A common alignment pattern or key provided on a mask may be used to perform alignment with both real and virtual substrate marks.

In the current example, substrate marks are provided on both the front and back sides of the substrate W at corresponding positions, as shown in FIG. 2. In FIGS. 3 and 4, only the substrate marks on the back side of the substrate W are shown, for clarity. According to this arrangement, when the substrate W is flipped over, by rotation about either of the X or Y axes, a substrate mark that was on the top side of the substrate W now may be on the underside of the substrate W, but at a position such that it may be imaged by an arm of the optical system 10a, 10b.

It will be noted that, because of the mirror arrangement, displacement of the substrate W in one direction parallel to an arm 10a, 10b of the optical system will displace the corresponding image 20a, 20b of a substrate mark WM1, WM2 on the under side of the substrate in the opposite direction. For example, in FIG. 3, if the substrate W were displaced to the right, the images 20a, 20b would be displaced to the left. Software controlling the alignment system may take this into account when determining the position of the substrate marks WM1, WM2 and when adjusting the relative positions of the substrate W and a mask when performing alignment. If the two arms of the optical system 10a, 10b are symmetric then the separation between the images 20A and 20B will in fact stay constant when the substrate is displaced.

In an alternative embodiment of the invention, a substrate table WT may be provided with a mirror arrangement that does not change the direction of movement of the images 20a, 20b with respect to the movement of the substrate marks WM1, WM2.

At least two substrate marks may be provided per side of the substrate W. A single mark may provide information about the relative positioning of an image of a specific point on a mask to a specific point on the substrate. However, to ensure the correct orientational alignment and magnification, at least two marks may be used.

Figure 5:
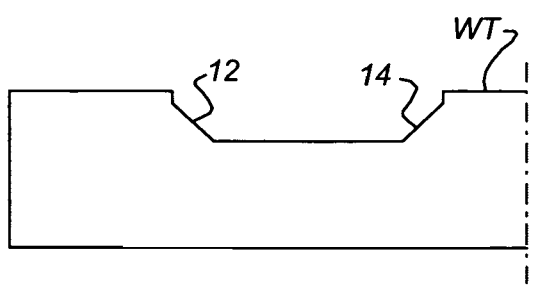
FIG. 5 is a cross section of a portion of a substrate table having integral optical components.

FIG. 5 shows a portion of the substrate table WT in cross section. According to one embodiment of the invention, the optical system 10a, 10b for imaging the substrate marks on the back side of a substrate may be built into the substrate table WT in a particular fashion. As shown in FIG. 5, the mirrors 12, 14 of an arm of the optical system may not be provided as discrete components, but are integral with the substrate table WT. Appropriate faces are machined into the substrate table WT, which may then be provided with a coating to improve reflectivity, thus forming the mirrors 12, 14. The optical system may be made from the same material as the substrate table, such a Zerodur™, which has a very low coefficient of thermal expansion and therefore ensures that high alignment accuracy can be maintained.

The substrate marks WM1, WM2, WM3, WM4 may be provided on the substrate W in order to allow alignment of the substrate W with respect to the projected patterned beam. Alignment is necessary to allow optimal positioning of different layers of the substrate W with respect to each other. A substrate W may be built up from a plurality of layers that are each formed on the substrate W one after the other and are subject to an exposure. Since the different layers are configured to form a working device, the different exposures should be optimally aligned with respect to each other.

As disclosed above, integrated circuits are made in layers. Each layer may start with the exposure of a (different) pattern on the substrate W. This pattern may need to fit optimally on the previous one. A measure for accomplished accuracy in this alignment is overlay O.

A formula may be derived to describe a relationship between the position of the substrate marks WM3, WM4 on the substrate W and the overlay O in case a conventional alignment technique is used, i.e. the substrate marks WM3, WM4 may be positioned on the first side of the substrate W.

Basically, the overlay O depends on how accurate the machine may expose the images and how accurate the substrate position is measured. These are two independent error sources.

The accuracy of the machine in exposing the images is called stage overlay S. The stage overlay S is the overlay difference between a first layer and a second layer when the substrate W stays on the stage in between the two exposures. The stage overlay S is thus a measure for the machine exposure positioning error.

The accuracy that may be obtained when measuring the position of the substrate W depends on the geometrical position of the substrate markers. Substrate alignment parameters include expansion, rotation and translation. The overlay error caused by substrate expansion and rotation are largest at the edge of the substrate.

The following formula may be derived to represent overlay O:

$$O = \sqrt{\left(\left(3\sigma\left(\frac{1}{\sqrt{2}} * \frac{D_W/2}{D_{PM}} + \frac{1}{\sqrt{2}}\right)\right)^2 + S^2\right)} \quad (1)$$

where:
$\sigma$ standard deviation for an alignment position as measured
$D_W$ substrate diameter
$D_{PM}$ distance between two alignment marks
S 3$\sigma$ (three times the standard deviation) for the stage overlay, and
O 3$\sigma$ (three times the standard deviation) of the overlay.

The value for $\sigma$ is a measure for the error in the distribution of the measurement of a mark position. If the error distribution is considered as a Gaussian distribution, the 3$\sigma$ value indicates the error value for which approximately 99.7% of all errors are smaller, as will be understood by the skilled person.

The value of $\sigma_{FS}$ (front side) for measuring a substrate mark positioned on the first side of the substrate differs from the value of $\sigma_{BS}$ (back side) for measuring a substrate mark positioned on the second side of the substrate W. Several reasons may be identified why a different value for $\sigma$ is found for a substrate mark provided on the second side of the substrate W, as for instance:

more optical elements are used to measure a substrate marker positioned on the second side of the substrate, so the alignment beam passes more optical surfaces;

the optics used for measuring a substrate marker on the second side of the substrate are more temperature dependent.

Figure 6:
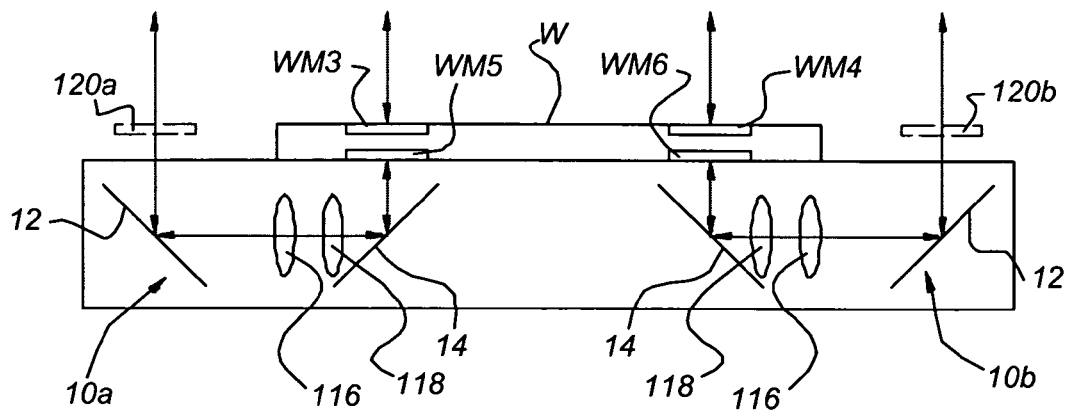
FIG. 6 is a cross section of a portion of a substrate table having integral optical components according to the invention.

According to the invention, an optical system may be built into the substrate table WT analogous to the optical system shown in FIG. 2 that provides optical access to substrate marks WM5, WM6 on the back side of the substrate W and provides a magnification M. An example of such an optical system according to the invention is shown in FIG. 6. The same references are used for identical parts seen in previous Figures.

It will be understood that $\sigma$ of formula (1) now becomes $\sigma_{BS}$, that is the sum of $\sigma_{FS}$ plus a term $\sigma_{BF}$ (back to front) taking into account the fact that an image of the substrate marks may be guided to the front side:

$$\sigma_{BS} = \sqrt{\sigma_{FS}^2 + \sigma_{BF}^2} \quad (2)$$

This results in a formula for O:

$$O = \sqrt{\left(\left(3\sqrt{\sigma_{FS}^2 + \sigma_{BF}^2}\left(\frac{1}{\sqrt{2}} * \frac{D_W/2}{D_{PM}} + \frac{1}{\sqrt{2}}\right)\right)^2 + S^2\right)} \quad (3)$$

The optical system comprises a pair of arms 10a, 10b. In one embodiment, each arm may include two mirrors, 12, 14 and two lenses 116, 118. Other configurations may be used. The mirrors 12, 14 in each arm are inclined such that the sum of the angles that they make with the horizontal is 90°. In this way, a beam of light impinging vertically on one of the mirrors will remain vertical when reflected off the other mirror. It will be understood that this 180° change in direction could also (partially) be obtained by other optical elements provided in the optical system, such as the lenses 116, 118.

The lenses 116, 118 may be designed in such a way that magnified images 120a, 120b of the substrate marks WM5, WM6 may be formed at the plane of the front (top) surface of the substrate W, corresponding to the vertical position of any substrate marks WM3, WM4 provided on the front side of the substrate W. The order of the lenses 116, 118 and the mirrors 12, 14 may be different, as appropriate to the optical system. For example, lens 118 may be between the mirror 14 and the substrate W.

The magnification factor M may be obtained by providing the lenses 116, 118 with different focal distances. The magnification M in this example is M=3, although any other suitable magnification M may be used. It will be understood by a skilled person that the positioning of the mirrors with respect to the substrate marks WM5, WM6 and the magnified images 120a, 120b may be different with respect to the embodiment depicted in FIG. 2, i.e. the distance between the substrate marks WM5, WM6 and the first lenses 116 may equal a third of the distance between the second lenses 118 and the magnified images 120a, 120b. This is schematically shown in FIG. 6. Other configurations may be used.

It will be understood that the distance between the mirrors 12, 14 determine the position in the direction of the optical arms where the magnified images 120a, 120b of the substrate marks WM5, WM6 are found. If the mirrors 12, 14 are positioned further away from each other, the magnified images 120a, 120b may move to the left, and right respectively. The position in the vertical direction, according to the orientation as shown in FIG. 6, where the magnified images 120a, 120b may be found depends on the focal distances of the lenses 116, 118, as will readily be understood by a skilled person. These could for instance be chosen such that the magnified images 120a, 120b are at the same (vertical) level as the substrate marks WM3, WM4 positioned at the front side of the substrate W, as is shown in FIG. 6.

The rest of the alignment hardware may be similar to the hardware used in a system in which no magnification is provided. Therefore, the magnified images 120a, 120b of the substrate marks WM5, WM6 preferably may be of a size that can be detected by the optics present to perform the alignment measurement. To achieve this, the substrate marks WM5, WM6 may be smaller, i.e. a factor M smaller, compared to the substrate markers WM1, WM2 used in the example referring to FIG. 2, in which no magnification was provided.

As a result of the magnification M, the movement of the substrate W may be enlarged with a factor equal to M, thus reducing part of the alignment error. So, $\sigma_{BS}$ as defined in formula (2) is replaced by a new value, referred to as $\sigma_{BS,M}$:

$$\sigma_{BS,M} = \sqrt{\left(\frac{\sigma_{FS}}{M}\right)^2 + \sigma_{BF}^2} \quad (4)$$

In certain cases, the value for $\sigma_{BS,M}$ is even smaller than the value of $\sigma_{FS}$ that may be obtained using direct measurement of wafer marks WM3, WM4 positioned at the front side of the substrate W.

It will be noted that, because of the magnification, displacement of the substrate W in one direction with respect to the optical system may displace the corresponding image 120a, 120b of a substrate mark WM5, WM6 on the under side of the substrate in the opposite direction and with a magnification M. For example, in FIG. 6, if the substrate W is displaced a certain distance to the right, the images 120a, 120b may be displaced M times the certain distance to the left. Software controlling the alignment system may take this into account when determining the position of the substrate marks WM5, WM6 and when adjusting the relative positions of the substrate W and a mask when performing alignment.

In an alternative embodiment of the invention, a substrate table WT may be provided with a mirror arrangement that does not change the direction of movement of the images 120a, 120b with respect to the movement of the substrate marks WM5, WM6. This can be done in many ways, as will be understood by a person skilled in the art. It may for instance be done using techniques similar to reflex cameras, using a mirror in combination with a prism.

According to formula (2), to obtain $\sigma_{BS}$=7.26 nm, a value of $\sigma_{FS}$=7.1 nm and a value of $\sigma_{BF}$=1.5 nm are needed. When a substrate table WT according to the invention is used, for instance, and provided with a magnification factor M=3, the value of $\sigma_{BS,M}$ becomes $\sigma_{BS,M}$=2.80 nm. A new value for the overlay $O_M$ will be obtained from the following formula:

$$O_M = \sqrt{\left(\left(3\sqrt{\left(\frac{\sigma_{FS}}{M}\right)^2 + \sigma_{BF}^2}\left(\frac{1}{\sqrt{2}} * \frac{D_W/2}{D_{PM}} + \frac{1}{\sqrt{2}}\right)\right)^2 + S^2} \quad (5)$$

It may be seen that using back-side alignment with a magnification according to the invention may provide more accurate results than using conventional back-side alignment or even using front-side alignment.

In principal, the invention may also be used for substrate marks provided on the front side of the substrate W. Modifications may be implemented to incorporate a design for this at the front side of the substrate table WT. The magnification optics may need to be fixed to the substrate table WT so that the movements of the substrate table WT are not enlarged.

As a result of the fact that the optical system built in the substrate table WT provides an image that has been magnified with a magnification M, the position of the substrate marks WM5, WM6 may be determined in a more accurate way. It will be understood that the capture range of the system may be reduced by a factor equal to the magnification factor M. The capture range is the area in the x and y direction in which the substrate marker may be located in order to detect the right mark position by the measurement system. As a result, in order to find the substrate marks WM5, WM6, the positioning of the substrate W with respect to the optical arms built in the substrate table WT may need to be made more accurate.

Figure 7:
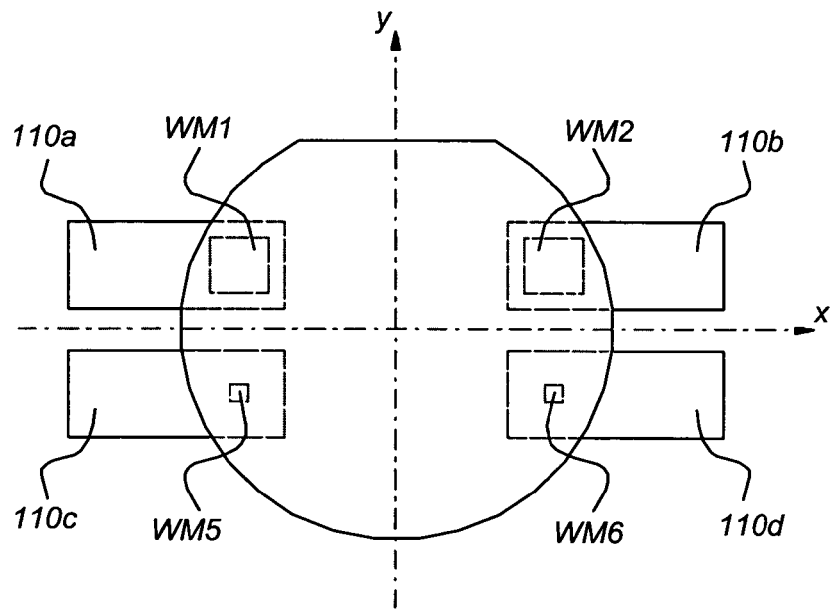
FIG. 7 is a top view of a portion of a substrate table having integral optical components according to a further embodiment of the invention.

This may be remedied, however, by providing a substrate table WT as depicted in FIG. 7, in which a first pair of optical arms 110a, 110b are used that do not provide magnification, and a second pair of optical arms 110c, 110d are used that provide magnification. The substrate W may be provided with first substrate marks WM1, WM2 that are positioned such that they may be detected via the first pair of optical arms 110a, 110b. The substrate W may be further provided with second substrate marks WM5, WM 6 that are positioned such that they may be detected via the second pair of optical arms 110c, 110d. The first substrate marks WM1, WM2 have a 'normal' size, which means that they may be detected via the optical arms 110a, 110b according to the state of the art, without providing magnification. The second substrate marks WM5, WM6 have a reduced size, in accordance with the magnification factor M that is built in the optical arms 110c, 110d.

The capture range of the first substrate marks WM1, WM2 is thus larger than the capture range of the second substrate marks WM5, WM6. The alignment may now be performed in two phases. First, an alignment position may be determined using the first substrate marks WM1, WM2 via the first pair of optical arms 110a, 110b. This may result in coarse alignment information. This coarse alignment information is used to find the second substrate marks WM5, WM6 during a second alignment phase, in which a fine alignment position is determined using the second substrate marks WM5, WM6 via the second pair of optical arms 110c, 110c.

In an alternative embodiment of the invention, a substrate table WT may be designed having a mix of optical arms, having different orientations (e.g. x and y direction) and having different magnifications. In fact, three or more optical branches may be provided having different magnifications M. For instance, three optical branches could be provided in one direction, the first optical branch having a magnification of 1, the second optical branch having a magnification of 3 and the third optical branch having a magnification of 9. The substrate W is in that case provided with three types of substrate marks, each type having dimensions that are adopted to be used in one of the three optical arms. Like this, a cascade of optical branches may be provided.

By using a plurality of optical branches, different alignment strategies may be implemented to improve the overlay accuracy.

The optical arms may also be provided with a structure to vary the magnification M provided by the optics provided in the optical arms. For instance by varying the position of the lenses 116, 118 in the direction of their optical axes the magnification M may be varied. According to a further alternative embodiment, the magnification M may be changed by providing a mechanism to replace a lens with a different lens, having a different focal distance. With the use of such mechanisms the magnification M may be altered based on the situation. It may also be used to overcome the smaller capture range that is associated with the invention.

Figure 8:
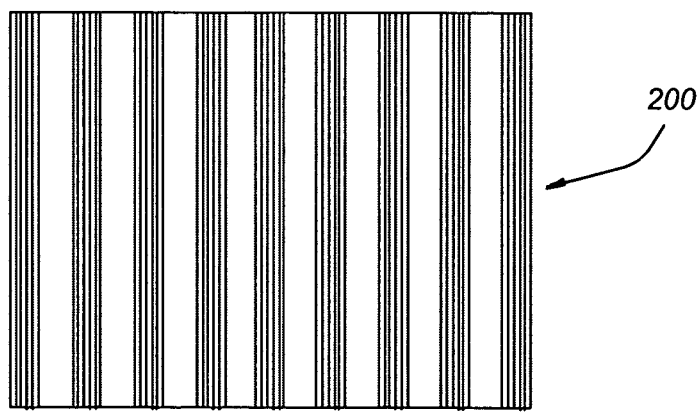
FIG. 8 depicts a mark that may be used in an embodiment according to the invention.

The substrate W may also be provided with substrate marks that may be used for different magnifications. FIG. 8 shows an example of such a substrate mark 200, comprising relatively thin lines, that are positioned in groups of, for instance, six (6) thin lines, to form relatively thick lines. The thick lines are used for measurements when using a first magnification factor M1, while the thin lines are used for measurements when using a second magnification factor $M_2$, where $M_1 < M_2$. It will be understood by a skilled person that many other substrate marks are conceivable that may be used in a similar way as substrate mark 200. In fact, all substrate marks having patterns with two or more typical dimensions may be used.

Since the optical arms according to the invention provide the image of the substrate marks WM5, WM6 with a magnification M that enables more accurate measurements, the location of the optical elements, such as the lenses 116, 118 and the mirrors 12, 14 need to be known with a great accuracy. However, these locations do not change with every substrate W and can therefore be corrected for by expressing this error as a systematic error.

It is also possible to use conventional front side substrate marks WM3, WM4 to determine the position of the substrate W in a first instance, for instance to overcome the problem of the small capture range associated with the substrate marks WM5, WM6 that are reduced in size. Based on this first determined position, the position of the substrate W may be determined in a more accurate way by using the substrate marks WM5, WM6 provided on the second side of the substrate W.

This, for instance, may be done in cases where the substrate marks WM3, WM4 provided on the front side of the substrate W may still be used for conventional alignment, but more accurate alignment is required. In that case, a more accurate alignment may be obtained by using the substrate marks WM5, WM6 that are suitable to be used in combination with optical arms provided with a magnification. It will be understood that the present invention may be used to provide a more accurate alignment, front side as well as back side. Providing a magnification M may advantageously be done in an optical arm provided in the substrate table WT.

The substrate table according to the invention may be provided with a magnification factor M>1, but it may also be provided with a magnification factor M<1, thus in fact being a reduction instead of a magnification. Such a substrate table WT can be used to solve the possible problem that the alignment system used is not able to find the substrate mark WT, when it is outside the capture range of the alignment system. By providing a substrate table WT arranged to provide an image of a substrate mark with a magnification factor being smaller than 1, the capture range is increased. It will be understood that then, instead of reduced substrate marks WM5, WM6, substrate marks should be provided on the substrate W that are increased in size, by a factor 1/M. Thus, in case the magnification factor is chosen M=¼, substrate marks are provided on the substrate W that are increased by a factor 4 (=1/¼).

It will be understood that increasing the capture range means that the accuracy is reduced. If a magnification factor M=¼ is used, the accuracy is reduced with a factor 4, for instance from 50 nm to 200 nm, while the capture range is increased, for instance from 88 µm to 352 µm.

As discussed above, a substrate table WT may be designed having a mix of optical arms, having different orientations (e.g. x and y direction) and having different magnifications. In fact, three or more optical branches may be provided having different magnifications M. For instance, three optical branches may be provided in one direction, the first optical branch having a magnification of ¼, the second optical branch having a magnification of 1 and the third optical branch having a magnification of 4. The substrate W may be provided with three types of substrate marks, each type having dimensions that are adopted to be used in one of the three optical arms. Like this, a cascade of optical branches may be provided.

It will be understood that the embodiments discussed above are exemplary to to practice the invention. Other configurations may be used to provide a magnification M.

A magnified image of substrate marks may also be obtained by using fibers, convex and/or concave mirrors. Furthermore, prisms may be used, analogous to a prism used in a reflex camera, to reverse the orientation of the image created of the substrate marks WM5, WM6. In fact, all kinds of optical elements may be used, as long as a correct redirection, focal plane and magnification are obtained.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A device for generating at least one virtual substrate mark, comprising:
   a substrate table that is arranged to support a substrate having at least one substrate mark;
   an optical system that is associated with the substrate table, the optical system having one or more optical arms comprising:
      at least two mirrors arranged to reflect radiation;
      at least two lenses positioned to receive radiation reflected from the mirrors, the lenses providing a magnification factor deviating from one
   wherein the one or more optical arms generate the at least one virtual substrate mark from a corresponding at least one substrate mark.

2. The device according to claim 1, wherein the magnification factor is larger than 1.

3. The device according to claim 1, wherein the magnification factor is smaller than 1.

4. The device according to claim 1, wherein the at least one substrate mark includes dimensions adjusted in accordance with the magnification factor.

5. The device according to claim 1, wherein the substrate table is arranged to support a back side of said substrate and the substrate table is provided with the optical system built into the substrate table for providing optical access to substrate marks provided on the back side of the substrate when the substrate is supported by the substrate table.

6. The device according to claim 1, wherein the at least two lenses include a first and a second lens having different focal distances and being positioned along an optical axis of the optical system.

7. The device according to claim 1, wherein the at least two mirrors are positioned such that a sum of individual angles between each one of the mirrors and a horizontal surface is substantially 90°.

8. The device according to claim 1, wherein the optical system generates at least one virtual substrate mark with a first magnification factor and at least one virtual substrate mark with a second magnification factor, the first magnification factor differing from the second magnification factor.

9. The device according to claim 8, wherein the optical system comprises a first optical arm arranged to provide the first magnification factor and a second optical arm arranged to provide the second magnification factor.

10. The device according to claim 8, wherein the optical system comprises an optical arm arranged to provide the first and the second magnification factor.

* * * * *